(12) United States Patent
Heo et al.

(10) Patent No.: US 10,892,783 B2
(45) Date of Patent: Jan. 12, 2021

(54) APPARATUS AND METHOD FOR DECODING POLAR CODES

(71) Applicant: Korea University Research and Business Foundation, Seoul (KR)

(72) Inventors: Jun Heo, Seoul (KR); Sung Hoon Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/458,338

(22) Filed: Jul. 1, 2019

(65) Prior Publication Data

US 2020/0127686 A1 Apr. 23, 2020

(30) Foreign Application Priority Data

Oct. 17, 2018 (KR) .................. 10-2018-0123795

(51) Int. Cl.
*H03M 13/11* (2006.01)
*H03M 13/29* (2006.01)
*H03M 13/13* (2006.01)
*H03M 13/45* (2006.01)

(52) U.S. Cl.
CPC ....... *H03M 13/2927* (2013.01); *H03M 13/13* (2013.01); *H03M 13/458* (2013.01)

(58) Field of Classification Search
CPC ............ H03M 13/2927; H03M 13/13; H03M 13/458; H03M 13/45; H03M 13/1111; H03M 13/1191; H03M 13/3707; H03M 13/6502; H03M 13/611
USPC ...................................................... 714/755
See application file for complete search history.

(56) References Cited

U.S. PATENT DOCUMENTS

| 10,312,948 | B1* | 6/2019 | Arikan | H04L 1/0045 |
| 2014/0208183 | A1* | 7/2014 | Mahdavifar | H03M 13/296 714/755 |
| 2014/0380114 | A1* | 12/2014 | Alexeev | H03M 13/2906 714/755 |
| 2018/0006767 | A1* | 1/2018 | Litsyn | H03M 13/13 |

(Continued)

FOREIGN PATENT DOCUMENTS

KR 10-1817168 B1 1/2018

OTHER PUBLICATIONS

Abbas, Syed Mohsin, et al. "Low Complexity Belief Propagation Polar Code Decoder", 2015 *IEEE Workshop on Signal Processing Systems (SiPS)*. IEEE, Aug. 25, 2015 (pp. 1-6).

(Continued)

*Primary Examiner* — Albert Decady
*Assistant Examiner* — Enam Ahmed
(74) *Attorney, Agent, or Firm* — NSIP Law

(57) ABSTRACT

The present disclosure relates to a method and an apparatus for decoding polar codes and the polar code decoding method according to an exemplary embodiment of the present disclosure is a polar code decoding method performed by a polar code decoding apparatus which includes receiving a code word vector generated by polar encoding; and decoding the code word vector based on a soft cancellation (SCAN) decoding method and a round-trip belief propagation (BP) decoding method, in the decoding, an inner code of the code word vector may be decoded by the round-trip belief propagation method and an outer code may be decoded by the SCAN decoding method.

9 Claims, 8 Drawing Sheets

(56) References Cited

U.S. PATENT DOCUMENTS

2018/0048418 A1* 2/2018 Ge .................. H04L 1/0038
2018/0226999 A1   8/2018 Wang et al.
2019/0036550 A1* 1/2019 Koike-Akino ........ H03M 13/13
2019/0245650 A1* 8/2019 Hui .................. H04L 1/0066

OTHER PUBLICATIONS

Korean Notice of Allowance dated Dec. 16, 2019 in counterpart Korean Patent Application No. 10-2018-0123795 ( 2 pages in Korean).

* cited by examiner

[FIG. 1]
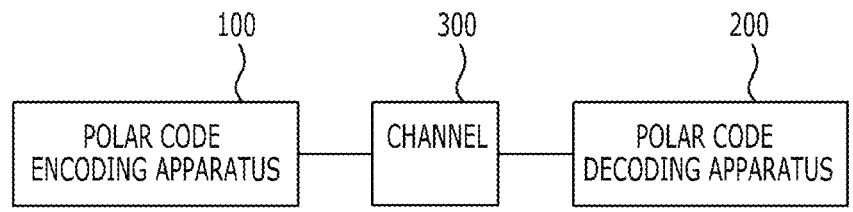
[FIG. 2]
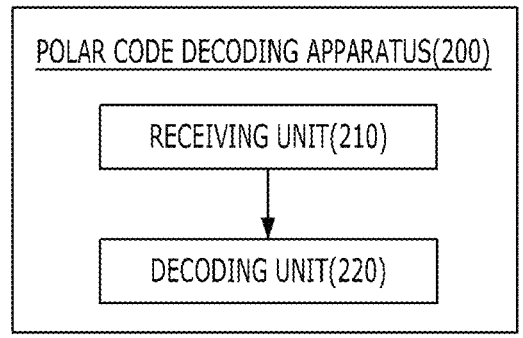
[FIG. 3]
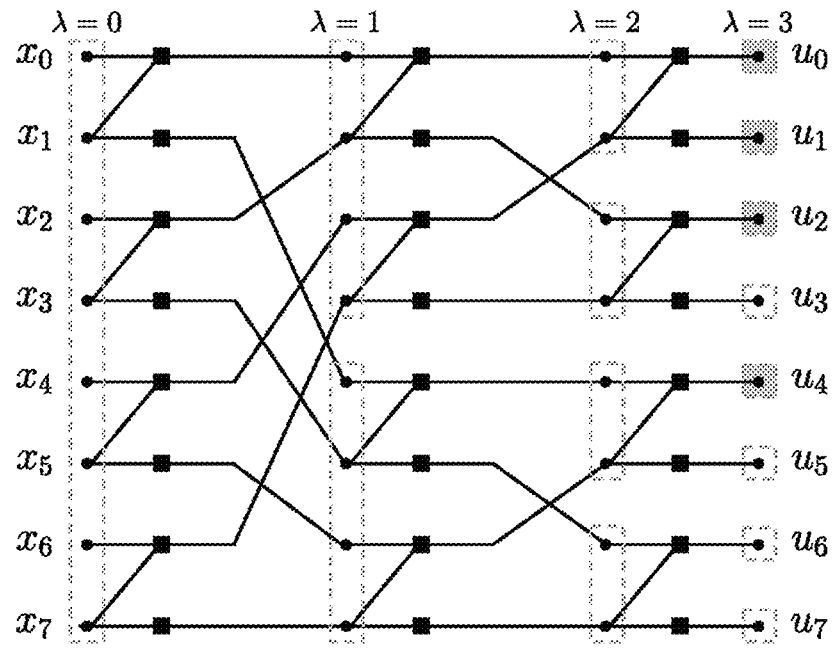

[FIG. 4]
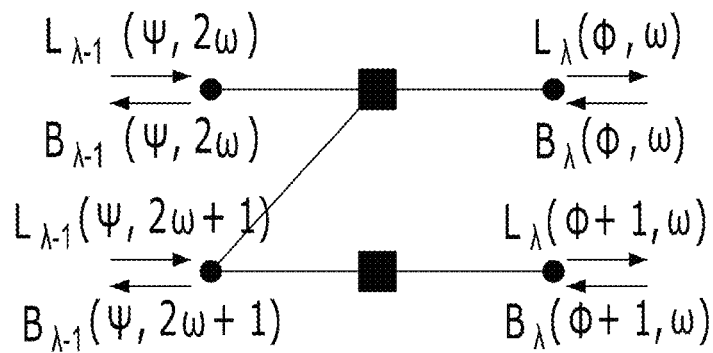
[FIG. 5]
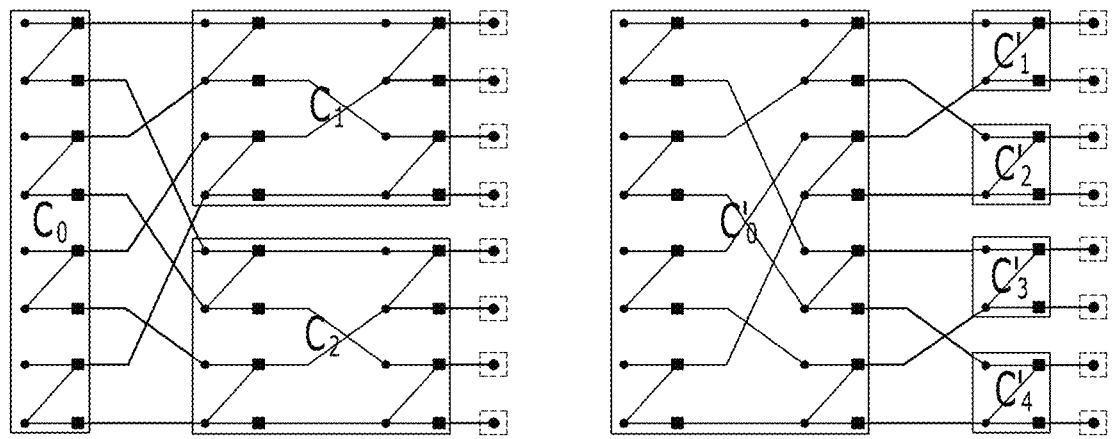
[FIG. 6]
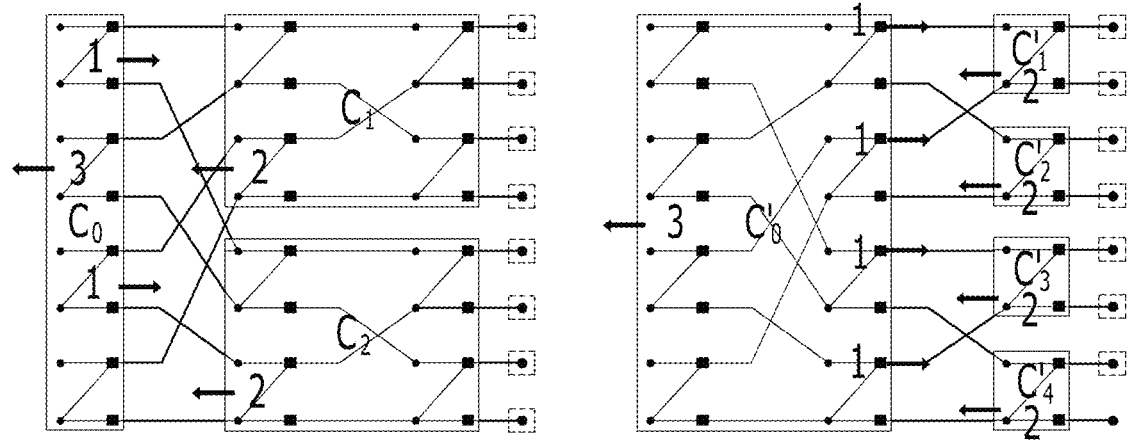

[FIG. 7]
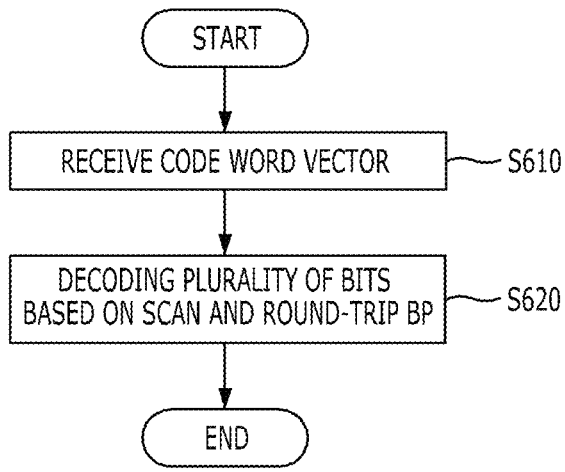
[FIG. 8]
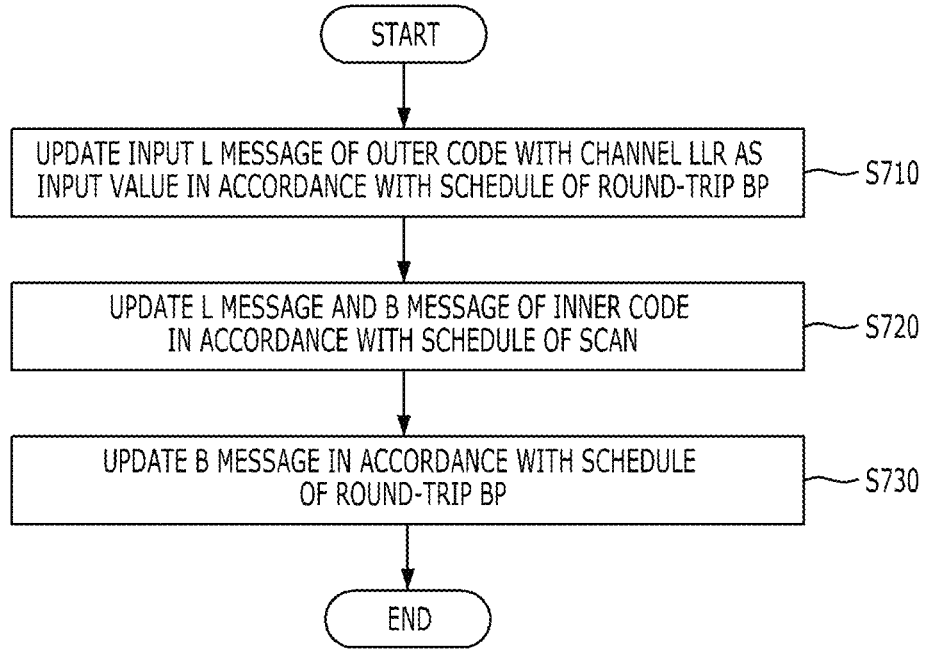

[FIG. 9]

Algorithm 1: Proposed decoding

1. $L_0(0,\omega) \leftarrow$ LLRs from channel, $\forall \omega \in \{0, \ldots, N-1\}$
2. $B_n(\phi, 0) \leftarrow \infty, \forall \phi \in \mathcal{A}$
3. Set all the uninitialized LLRs to 0
4. for $l = 1, \ldots, l_{max}$ do
5.     for $\lambda = 0, \ldots, s-1$ do
6.         Update $L_{\lambda+1}(\phi, \omega)$ using (1) and (2)
7.     for $C_i, \forall i \in \{1, \ldots, s\}$ do in parallel
8.         Update $L_{\lambda+1}(\phi, \omega)$ and $B_{\lambda+1}(\phi, \omega)$ in each inner code using (1)–(4) based on the serial message updating schedule
9.     for $\lambda = s-1, \ldots, 0$ do
10.        Update $B_{\lambda+1}(\phi, \omega)$ using (3) and (4)
11. for $i = 0, \ldots, N-1$ do
12.     if $B_n(i, 0) + L_n(i, 0) \geq 0$ then $\hat{u}_i \leftarrow 0$
13.     else $\hat{u}_i \leftarrow 1$

[FIG. 10]
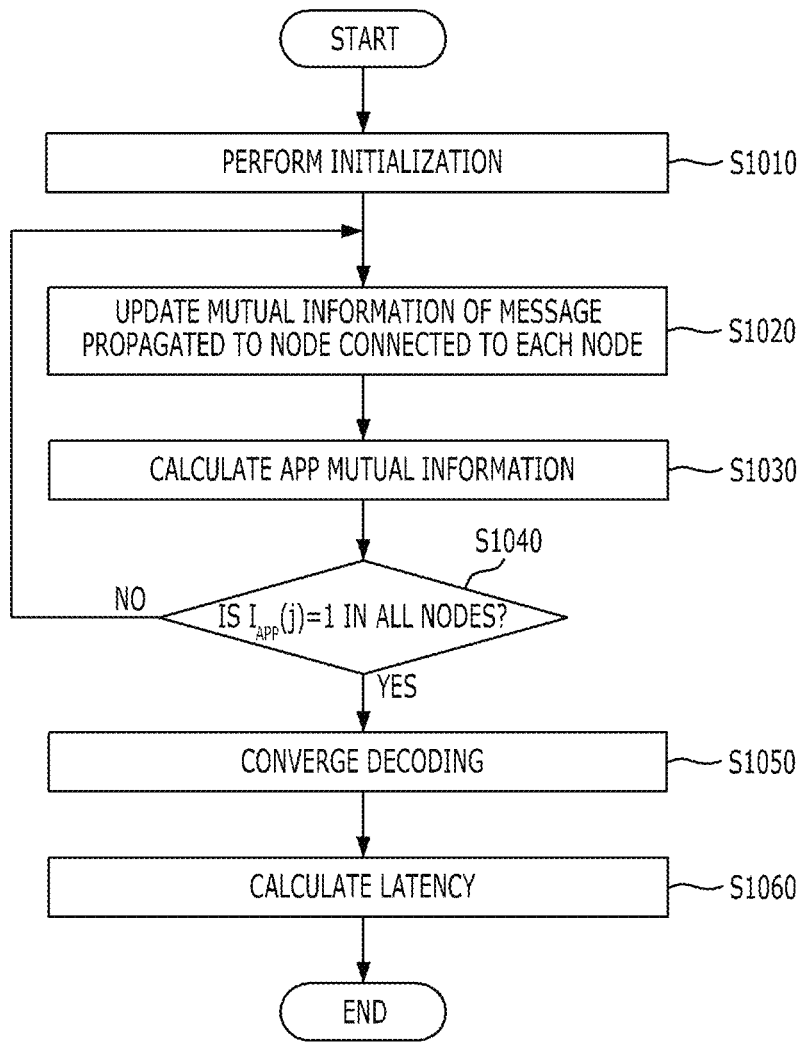

[FIG. 11]

Algorithm 2: Convergence of the proposed decoding

1. $I_0^L(0, \omega) \leftarrow J\left(\sqrt{8RE_b/N_0}\right), \forall \omega \in \{0, \ldots, N-1\}$
2. $I_n^B(\phi, 0) \leftarrow 1, \forall \phi \in \mathcal{A}$
3. Set all the uninitialized mutual information to 0
4. while $l < l_{max}$ do
5.     for $\lambda = 0, \ldots, s-1$ do
6.         Update $I_{\lambda+1}^L(\phi, \omega)$ using (11) and (12)
7.     for $C_i, \forall i \in \{1, \ldots, s\}$ do in parallel
8.         Update $I_{\lambda+1}^L(\phi, \omega)$ and $I_{\lambda+1}^B(\phi, \omega)$ in each inner code using (11)–(14) based on the serial message updating schedule
9.     for $\lambda = s-1, \ldots, 0$ do
10.        Update $I_{\lambda+1}^B(\phi, \omega)$ using (13) and (14)
11.     for $j = 0, \ldots, N-1$ do
12.        Calculate $I_{APP}(j)$ using (9)
13.     if $\min_{\forall j \in \mathcal{A}} I_{APP}(j) == 1$ then
14.        $l_s \leftarrow l, l \leftarrow l_{max}$
15.     else
16.        $l \leftarrow l + 1$

[FIG. 12]
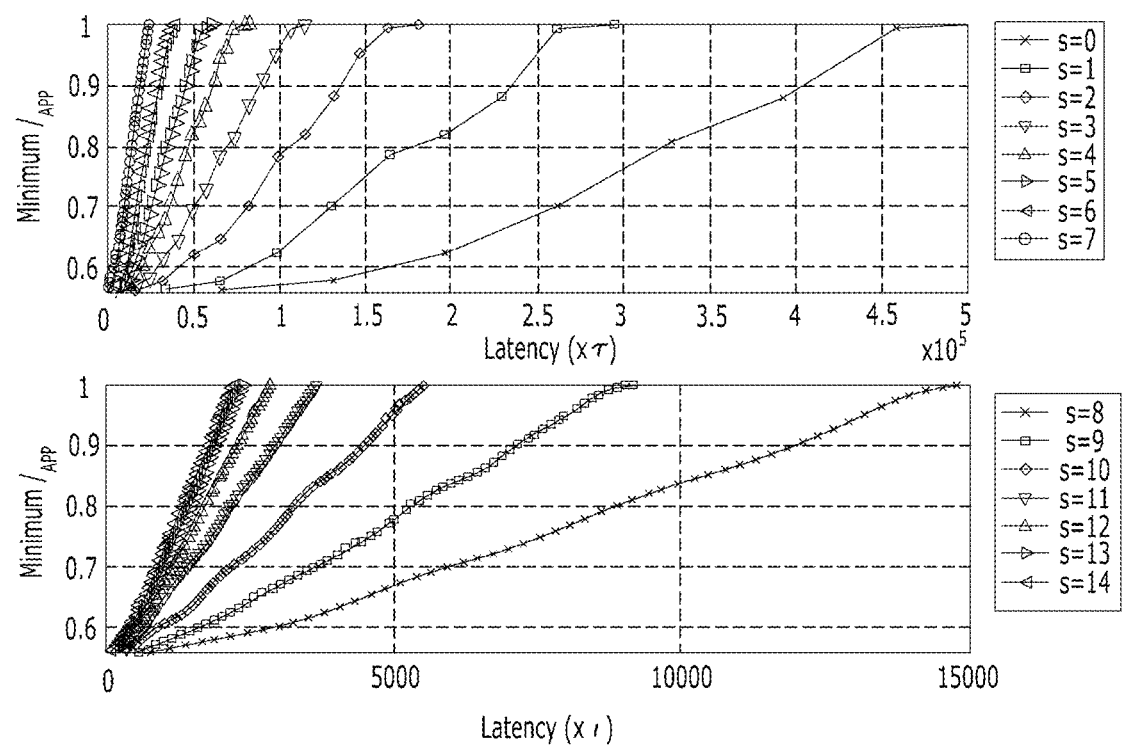

[FIG. 13]
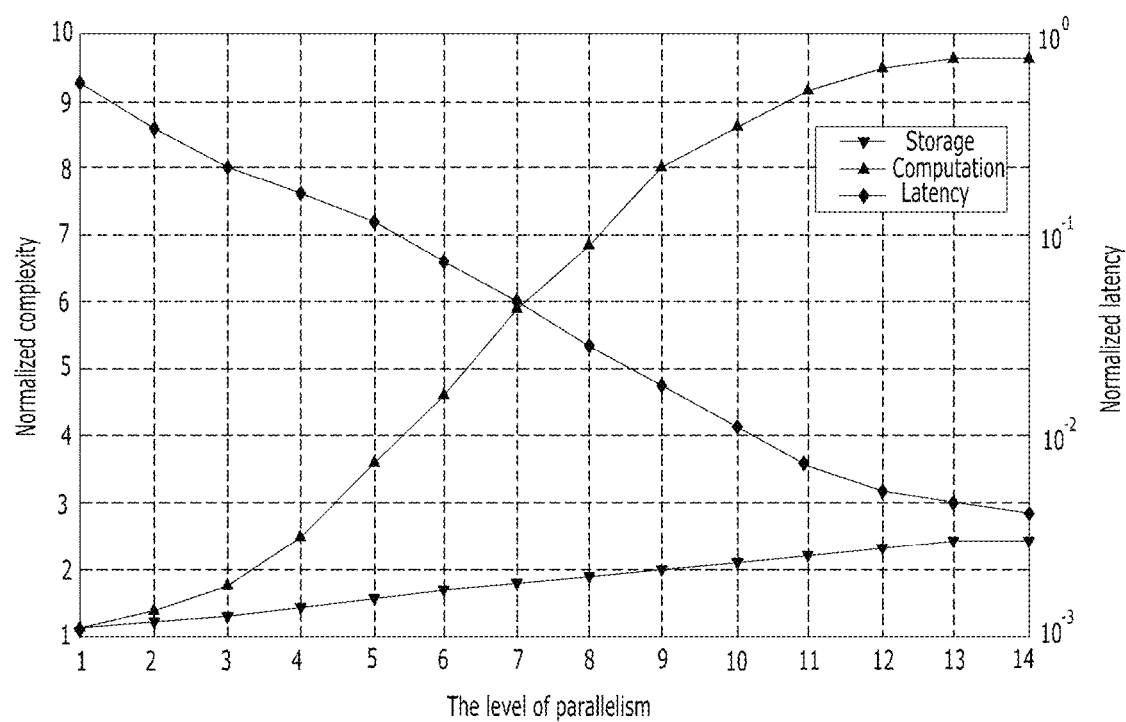

APPARATUS AND METHOD FOR DECODING POLAR CODES

CROSS-REFERENCE TO RELATED APPLICATIONS

This application claims the priority of Korean Patent Application No. 10-2018-0123795 filed on Oct. 17, 2018, in the Korean Intellectual Property Office, the disclosure of which is incorporated herein by reference.

BACKGROUND

Field

The present disclosure relates to a method and an apparatus for decoding polar codes, and more particularly, to soft-out decoding method and apparatus which change a decoding schedule in accordance with requirements of a system to adjust a latency, a storage complexity, and a computational complexity.

Description of the Related Art

A polar code is a linear block code proposed by Arikan and is a first error correction code proved to have an explicit construction in a binary-input discrete memoryless channel and theoretically achieve Shannon's channel capacity. Due to this property, recently, the polar code is being actively studied in the error correction code field. Recently, the polar code is adopted as a standard error correction code also in 5G technology which is the next generation mobile communication standard.

Arikan proposed a successive cancellation (SC) decoding scheme which is hard-output decoding to achieve a channel capacity by utilizing a characteristic obtained when a code is built, and many decoding schemes have been studied based on this scheme. Among them, CRC-aided SC list (CA-SCL) decoding has the best performance and is also utilized in the standard technology.

However, according to all SC-based decoding schemes, the decoding is sequentially performed. The sequential decoding cannot be performed in parallel because the order of calculations necessary for decoding is fixed. Therefore, the SC based decoding schemes have good performance, but are disadvantageous in that storage and computational complexities are low and the latency is high and thus studies are actively conducted to solve the disadvantages.

A representative scheme which is different from the SC decoding scheme is a belief propagation (BP) decoding scheme which is soft-output decoding. It is known that the BP decoding is a decoding scheme of low-density parity-check (LDPC) code and performs operations in parallel so that the decoding process is very high. The BP decoding performance of the polar code is inferior to that of the CA-SCL decoding, but implementation of the BP decoding is actively studied because of high degree of parallelism that enables high processing speed and low latency. Further, the BP decoding is soft-output decoding so that it may be utilized also in a system in which detection and decoding are simultaneously performed, such as a turbo receiver.

In order to solve the inferior performance of the BP decoding, soft cancellation (SCAN) decoding has been proposed. Similarly to the BP, the SCAN decoding is soft-output decoding, but is a sequential decoding in accordance with the schedule of SC. Therefore, similarly to the SC decoding, the SCAN decoding has high latency but has low storage and computational complexities.

As described above, the SCAN has low storage and computational complexities and high latency, but the BP has low latency and high storage and computational complexities. Therefore, the SCAN and the BP cannot be selected in a system where a reasonable latency and complexity are required as an intermediate point or requirements vary depending on the working environment.

Therefore, a soft-output decoding scheme which is capable of adjusting a latency, a storage complexity, and a computational complexity by changing a decoding schedule in accordance with requirements of the system has been demanded.

RELATED ART DOCUMENT

Patent Document

Korean Registered Patent Publication No. 10-1817168 (published on Jan. 10, 2018).

SUMMARY

A technical object to be achieved by the present disclosure is to provide a method and an apparatus for decoding polar codes which are capable of adjusting a latency, a storage complexity, and a computational complexity by changing a decoding schedule in accordance with requirements of the system.

Another technical object to be achieved by the present disclosure is to provide a method and an apparatus for decoding polar codes which are capable of measuring a convergence rate of a polar code decoding scheme.

Technical objects of the present disclosure are not limited to the aforementioned technical objects and other technical objects which are not mentioned will be apparently appreciated by those skilled in the art from the following description.

According to an aspect of the present disclosure, a polar code decoding method by a polar code decoding apparatus includes: receiving a code word vector generated by polar encoding; and decoding the encoding vector based on a soft cancellation (SCAN) decoding method and a round-trip belief propagation (BP) decoding method, and in the decoding, an inner code of the code word vector is decoded by the round-trip BP method and an outer code is decoded by the SCAN decoding method.

Desirably, when a length of the polar code is N, a length of the inner code is N and the number of inner codes is one, a length of the outer code is N/S and the number of outer code is the number corresponding to a level s of parallelism and S is $2^s$.

Desirably, the decoding includes: updating an input L message of an outer code with a channel LLR as an input value in accordance with a schedule of a round-trip BP; updating an L message and a B message of the inner code in accordance with a schedule of SCAN; and updating an input B message of the outer code with an output LLR updated in accordance with the schedule of the SCAN as an input value in accordance with a schedule of the round-trip BP, and the L message is a message propagated from the left to the right and the B message is a message propagated from the right to the left.

Desirably, the polar code decoding method may further include: measuring a convergence rate of polar code decoding based on mutual information of the L message and the B message.

Desirably, the measuring of a convergence rate includes: updating the mutual information of the L message and the B message propagated to nodes connected to each node; determining that the decoding is converged when APP mutual information which is mutual information between prior LLRs calculated in a code associated with a code word node is 1 in all nodes; and calculating a clock cycle taken to converge the decoding as a convergence rate.

Desirably, the mutual information may be updated in accordance with the decoding schedule of the polar codes.

Desirably, the convergence rate may be calculated by multiplying the number of iterative decoding at the moment of convergence and a clock cycle taken for one decoding.

According to another aspect of the present disclosure, a polar code decoding apparatus includes: a receiving unit which receives a code word vector generated by polar encoding; and a decoding unit which decodes the code word vector based on a soft cancellation (SCAN) decoding method and a round-trip belief propagation (BP) decoding method to output a decoding data bit string, and the decoding unit decodes an inner code of the code word vector by the round-trip BP decoding method and decodes an outer code by the SCAN decoding method.

Desirably, the decoding unit updates an input L message of an outer code with a channel LLR as an input value in accordance with a schedule of a round-trip BP, updates an L message and a B message of an inner code in accordance with a schedule of SCAN, and updates an input B message of the outer code with an output LLR updated in accordance with the schedule of the SCAN as an input value in accordance with the schedule of the round-trip BP.

Desirably, the polar code decoding apparatus may further include: a latency measuring unit which measures a convergence rate of polar code decoding based on mutual information of the L message and the B message.

Desirably, the latency measuring unit may update mutual information of each of an L message and a B message which are propagated to nodes connected to each node, determine that the decoding is converged when APP mutual information which is mutual information between prior LLRs calculated in a code correlated with a code word node is 1 in all the nodes, and calculate a clock cycle required to completely converge the decoding as a convergence rate.

According to the present disclosure, it is possible to satisfy the requirements of various systems by adjusting a level of parallelism to be flexibly changed from the most sequential level to the most parallel level, and thus to adjust the latency, the storage complexity, and the computational complexity.

That is, according to the present disclosure, when a level of parallelism of the decoding scheme is adjusted, the latency and the complexity may be adjusted by a trade-off relationship. Therefore, the decoding schedule may be flexibly changed depending on whether a latency of the decoding is important or the complexity is important, and thus it is possible to cope with various system requirements without other decoding schemes.

Further, a convergence rate of the decoding scheme may be measured using the mutual information.

The effects of the present disclosure are not limited to the technical effects mentioned above, and other effects which are not mentioned can be clearly understood by those skilled in the art from the following description.

BRIEF DESCRIPTION OF THE DRAWINGS

The above and other aspects, features and other advantages of the present disclosure will be more clearly understood from the following detailed description taken in conjunction with the accompanying drawings, in which:

FIG. 1 is a view for explaining an encoding/decoding system of polar codes according to an exemplary embodiment of the present disclosure;

FIG. 2 is a block diagram for explaining a decoding apparatus of polar codes according to an exemplary embodiment of the present disclosure;

FIG. 3 is a view illustrating a factor graph for explaining soft-output decoding according to an exemplary embodiment of the present disclosure;

FIG. 4 is a view illustrating a protograph of the factor graph illustrated in FIG. 3;

FIG. 5 is a view illustrating two different connection codes for a polar code whose length N is 8, according to an exemplary embodiment of the present disclosure;

FIG. 6 is a view for explaining a decoding procedure of FIG. 5;

FIG. 7 is a flowchart illustrating a decoding method of polar codes according to an exemplary embodiment of the present disclosure;

FIG. 8 is a flowchart illustrating a decoding method of an encoding vector according to an exemplary embodiment of the present disclosure;

FIG. 9 is a view illustrating a decoding algorithm of polar codes according to an exemplary embodiment of the present disclosure;

FIG. 10 is a flowchart illustrating a method of measuring a convergence rate of decoding polar codes according to an exemplary embodiment of the present disclosure;

FIG. 11 is a view illustrating an algorithm of measuring a convergence rate of decoding polar codes according to an exemplary embodiment of the present disclosure;

FIG. 12 is a graph illustrating a result when a latency of decoding polar codes is measured by mutual information according to an exemplary embodiment of the present disclosure; and FIG. 13 is a graph illustrating how a latency, a storage complexity, and a computational complexity change when a level of parallelism is changed, according to an exemplary embodiment of the present disclosure.

DETAILED DESCRIPTION OF THE EMBODIMENT

Hereinafter, exemplary embodiments of the present disclosure will be described more fully with reference to the accompanying drawings for those skilled in the art to easily implement the present disclosure. As those skilled in the art would realize, the described embodiments may be modified in various different ways, all without departing from the spirit or scope of the present disclosure.

In order to clearly illustrate the present disclosure, parts not related to the description are omitted. Accordingly, the drawings and description are to be regarded as illustrative in nature and not restrictive. Like reference numerals designate like elements throughout the specification. Therefore, reference numerals which are used in previous drawings may be used for another drawing.

The size and thickness of the components shown the drawings are optionally determined for better understanding and ease of description, and the present disclosure is not limited to the examples shown in the drawings. In the drawings, thicknesses of several layers and regions are enlarged for clear expressions.

Hereinafter, a method and an apparatus for decoding polar codes according to an exemplary embodiment of the present disclosure will be described in more detail with reference to accompanying drawings.

FIG. 1 is a view for explaining an encoding/decoding system of polar codes according to an exemplary embodiment of the present disclosure.

Referring to FIG. 1, an encoding/decoding system of polar codes according to an exemplary embodiment of the present disclosure includes a polar code encoding apparatus 100, a polar code decoding apparatus 200, and a channel 300. In the polar code encoding/decoding system, some components among various components which are exemplarily illustrated in FIG. 1 may be omitted or other components may be added.

The polar code encoding apparatus 100 encodes data using polar codes and converts a code word, and then transmits the code word through a channel. The polar code is a code which achieves a channel capacity using a channel polarization phenomenon generated when a plurality of channels is coupled and then appropriately separated.

The polar code decoding apparatus 200 receives and demodulates a signal through the channel 300. The polar code decoding apparatus 200 decodes the received code word using the polar code.

FIG. 2 is a block diagram for explaining a polar code decoding apparatus according to an exemplary embodiment of the present disclosure.

Referring to FIG. 2, a polar code decoding apparatus 200 according to an exemplary embodiment of the present disclosure includes a receiving unit 210 and a decoding unit 220.

The receiving unit 210 receives a communication signal including polar codes through a channel. The communication channel may correspond to a binary input discrete memoryless channel.

The decoding unit 220 decodes an encoding vector based on a soft cancellation (SCAN) decoding method and a round-trip belief propagation (BP) decoding method to output a decoded data bit string. In this case, the decoding unit 220 decodes an inner code of the code word vector by the round-trip BP decoding method and decodes an outer code by the SCAN decoding method.

As described above, the polar code decoding apparatus 200 performs the decoding based on the SCAN and the round-trip BP which are soft-output decoding of the polar codes and the soft-output decoding is performed based on a factor graph expression of the polar code.

In the meantime, the polar code decoding apparatus 200 configured as described above may further include a latency measuring unit (not illustrated).

The latency measuring unit updates mutual information of each of an L message and a B message which are propagated to nodes connected to each node and determines that the decoding is converged when APP mutual information $I_{APP}(j)$ which is mutual information between prior LLRs calculated in a code associated with a code word node is 1 in all the nodes and calculates a clock cycle required to completely converge the decoding as a latency.

That is, the latency measuring unit updates mutual information of a message $I_\lambda^L(\phi,\omega)$ which is propagated from the left to the right and mutual information $I_\lambda^B(\phi,\omega)$ of a message which is propagated from the right to the left. In this case, the mutual information may be updated in accordance with the schedule of the decoding algorithm of the polar codes.

Thereafter, the latency measuring unit may calculate APP mutual information which is mutual information between prior LLRs calculated in a code associated with a code word node. Thereafter, the latency measuring unit considers that the decoding is converged when the calculated APP mutual information is 1 in all the nodes. The latency measuring unit may calculate a clock cycle taken for the decoding to be completely converged by multiplying the number of iterative decoding at the moment that the iterative decoding is converged while performing the iterative decoding and a clock cycle for one decoding.

In the meantime, according to the present disclosure, the polar code decoding apparatus 200 configured as described above may satisfy the requirements of various systems by adjusting a level of parallelism to be flexibly changed from the most sequential level to the most parallel level, and thus to adjust the latency, the storage complexity, and the computational complexity. That is, the polar code decoding apparatus 200 may flexibly adjust the latency and the complexity with a trade-off relationship.

FIG. 3 is a view illustrating a factor graph for explaining soft-output decoding according to an exemplary embodiment of the present disclosure. FIG. 4 is a view illustrating a protograph of the factor graph illustrated in FIG. 3.

The polar code is defined as a code length N (N is a natural number), the number K (K is a natural number) of information bits, and a bit index set $\mathcal{A} \subset [N]$ for an information bit. Further, the information data is expressed as $u_0^{N-1}=(u_0, \ldots, u_{N-1})$, the code word is expressed as $x_0^{N-1}=(x_0, \ldots, x_{N-1})$, and the received sequence is expressed as $y_0^{N-1}=(y_0, \ldots, y_{N-1})$.

During an encoding process to a polar code, K bits are selected from the data bit string U at a ratio corresponding to a channel capacity in accordance with the channel polarization phenomenon to input information and a fixed value is input to the remaining (N-K) frozen bits to be encoded. A code word, that is, the code bit string X is expressed by $X=u \cdot G_N$. Here, $G_N$ is $G_N=B_N \cdot F_2^{\otimes n}$, $B_N$ represents a bit reversal permutation matrix, and $F_2^{\otimes n}$ represents a n-order Kronecker power of $$F_2 = \begin{bmatrix} 1 & 0 \\ 1 & 1 \end{bmatrix}.$$

When $i \in \mathcal{A}$, a bit $u_i$ is an information bit, when $i \notin \mathcal{A}$, the bit $u_i$ is a frozen bit, and the frozen bit is set as 0.

FIG. 3 illustrates a factor graph of a polar code having a code length N (=8) and a code rate of ½. A vector x and a vector u refer to a code word and an information message, respectively. Each node is defined by three variables of a layer $\lambda$, a group $\phi$, and an order $\omega$ of nodes in the group. The layer is a vertical axis on a factor graph and the group is expressed by a dotted-line rectangle in the layer.

In the factor graph, each node $(\lambda, \phi, \omega)$ has two associated logarithmic likelihood ratio (LLR) messages $L_\lambda(\phi,\omega)$ and $B_\lambda(\phi,\omega)$ which are propagated to the right and the left.

The polar code decoding apparatus iteratively updates a plurality of messages in the factor graph. In this case, the plurality of messages is divided into an L message which is propagated from leftmost nodes to rightmost nodes and a B message which is propagated from the rightmost nodes to the leftmost nodes by switching the direction. The plurality of messages uses a logarithmic likelihood ratio (LLR) which is expressed by a specific probability of a transmission value of a node associated with the plurality of messages.

FIG. 4 illustrates a relationship of an L message propagated to the right and a B message propagated to the left which are two LLR messages associated with nodes on a protograph. The LLR messages may be calculated as represented in the following Equation 1.

$$L_\lambda(\phi,\omega)=L_{\lambda-1}(\psi,2\omega) \boxplus [L_{\lambda-1}(\psi,2\omega+1)+B_\lambda(\phi,\omega+1)]$$

$$L_\lambda(\phi+1,\omega)=L_{\lambda-1}(\psi,2\omega+1)+[L_{\lambda-1}(\psi,2\omega) \boxplus B_\lambda(\phi,\omega)]$$

$$B_\lambda(\psi,2\omega)=B_\lambda(\phi,\omega) \boxplus [B_\lambda(\phi+1,\omega)+L_{\lambda-1}(\psi,2\omega+1)]$$

$$B_\lambda(\psi+1,2\omega+1)=B_\lambda(\phi+1,\omega)+[B_\lambda(\phi,\omega) \boxplus L_{\lambda-1}(\psi,2\omega)] \quad \text{[Equation 1]}$$

Here, an operator $\boxplus$ is defined as represented in the following Equation 2.

$$\alpha \boxplus \beta \triangleq 2 \tanh^{-1}\left[\tanh\left(\frac{\alpha}{2}\right)\tanh\left(\frac{\beta}{2}\right)\right] \quad \text{[Equation 2]}$$

In the meantime, since the polar code is recursively configured, the code may be considered as a concatenated code. Therefore, in the present disclosure, the polar code having a length N may be defined as a concatenated code of a plurality of outer codes having a length N/S and one inner code having a length N. Here, $N=2^n$ and $S=2^s$ and s may be a level of parallelism which determines the number of outer codes.

FIG. 5 is a view illustrating two different connection codes for a polar code whose length N is 8, according to an exemplary embodiment of the present disclosure. FIG. 5A illustrates an inner code $C_0$, a first outer code C1 and a second outer code C2 each having a length of 4 and FIG. 5B illustrates an inner code $C'_0$, a first outer code $C'_1$, a second outer code $C'_2$, a third outer code $C'_3$, and a fourth outer code $C'_4$ each having a length of 2. In the case of the polar code having a length of 8, two connection relationships are illustrated. Therefore, in the case of various polar codes whose length is 16 or 32, $2^{(n-1)}$ connection relationships may be illustrated.

One inner code according to the present disclosure is subjected to round-trip BP decoding and the outer codes are subjected to SCAN decoding in parallel.

Specifically, the polar code decoding apparatus performs the decoding through three steps. In a first step, the L message of the outer code is updated with the channel LLR as an input value in accordance with the schedule of the round-trip BP. In this case, the L message is updated in parallel in the unit of layer. In a second step, the L message and the B message are updated with the L message updated in the first step as an input value in accordance with the SCAN schedule. In a third step which is the final step, when the B message is updated in accordance with the schedule of the round-trip BP like the first step, the decoding is completed. In this case, the L message and the B message may be updated using Equation 1.

Such a polar code decoding method will be described with reference to FIG. 6.

FIG. 6 is a view for explaining a decoding procedure of FIG. 5. The number represented with a red color in FIG. 6 refers to a decoding order.

First, FIG. 6A will be described.

First, the polar code decoding apparatus updates the input L message of the outer code with the channel LLR as an input value in accordance with the schedule of the round-trip BP in an inner code $C_0$ and simultaneously inputs the updated L message to the first outer code $C_1$ and the second outer code $C_2$.

By doing this, the polar code decoding apparatus updates the L message and the B message with the updated L message as an input value in the first outer code $C_1$ and the second outer code $C_2$ in accordance with the SCAN schedule. In this case, the message in the first outer code $C_1$ and the second outer code $C_2$ may be updated in parallel. Therefore, the output messages of the first outer code $C_1$ and the second outer code $C_2$ are simultaneously input as an input message of the inner code $C_0$.

Therefore, the polar code decoding apparatus updates the B message in the inner code $C_0$ in accordance with the schedule of the round-trip BP.

FIG. 6B will be described.

First, the polar code decoding apparatus updates the input L message of the outer code with the channel LLR as an input value in accordance with the schedule of the round-trip BP in an inner code $C'_0$ and simultaneously inputs the updated L message to the first outer code $C'_1$, the second outer code $C'_2$, the third outer code $C'_3$, and the fourth outer code $C'_4$.

By doing this, the polar code decoding apparatus updates the L message and the B message with the updated L message as an input value in the first outer code $C'_1$, the second outer code $C'_2$, the third outer code $C'_3$, and the fourth outer code $C'_4$ in accordance with the SCAN schedule. In this case, the message of the first outer code $C'_1$, the second outer code $C'_2$, the third outer code $C'_3$, and the fourth outer code $C'_4$ may be updated in parallel. Therefore, the output messages of the first outer code $C'_1$, the second outer code $C'_2$, the third outer code $C'_3$, and the fourth outer code $C'_4$ may be simultaneously input to the inner code $C'_0$.

Therefore, the polar code decoding apparatus updates the B message in accordance with the schedule of the round-trip BP based on the message input to the inner code $C'_0$.

In the meantime, according to the present disclosure, the SCAN algorithm is a scheme in which s=0, which is serialized extreme and the round-trip BP algorithm is a scheme in which s=(n−1), which is parallelized extreme. Therefore, the polar code decoding apparatus provides explicit scheduling of soft-output polar decoding including two extremes. Further, the polar code decoding apparatus may gradually change the update schedule from the most serial way to the most parallel way. In this case, s is controlled to determine a degree of parallelism of the decoding. Therefore, s may be referred to as a level of parallelism.

The polar code decoding apparatus according to the present disclosure may be flexibly changed from the most serial way to the most parallel way by adjusting the level of parallelism to satisfy the requirements of various systems.

FIG. 7 is a flowchart illustrating a decoding method of polar codes according to an exemplary embodiment of the present disclosure.

Referring to FIG. 7, the polar code decoding apparatus receives a code word vector generated by the polar encoding in step S610. The code word vector may be generated by binary multiplication of a source vector of a length of 1×N to be transmitted and a polar code generating matrix having a size of N×N. The code word vector transmitted from a transmission side is received at a reception side to initialize the decoding of the polar code.

When step S610 is performed, the polar code decoding apparatus decodes the encoding vector based on the SCAN decoding method and the round-trip BP decoding method in step S620. In this case, the polar code decoding apparatus decodes an inner code of the code word vector by the round-trip belief propagation method and decodes an outer code by the SCAN decoding method.

By doing this, the polar code decoding apparatus outputs a polar decoding data bit string.

A decoding method of the polar code decoding apparatus will be described in detail with reference to FIG. 8.

FIG. 8 is a flowchart illustrating a decoding method of an encoding vector according to an exemplary embodiment of the present disclosure and FIG. 9 is a view illustrating a decoding algorithm of polar codes according to an exemplary embodiment of the present disclosure.

Referring to FIG. 8, the polar code decoding apparatus updates an input L message of an outer code with a channel LLR as an input value in accordance with a schedule of a round-trip BP in step S710. Here, the channel LLR may refer to channel information that each variable node receives from a channel based on a signal received from the channel. The decoding apparatus may update the input L message of the outer code using Equation 1.

When step S710 is performed, the polar code decoding apparatus updates the L message and the B message of the inner code in accordance with the schedule of SCAN in step S720. In this case, the polar code decoding apparatus simultaneously updates the messages of the outer codes.

When step S720 is performed, the polar code decoding apparatus updates an input B message of an outer code with an output LLR of step S720 as an input value in accordance with a schedule of a round-trip BP in step S730.

Here, R is a code rate of a polar code and $E_b/N_c$ is a signal to noise ratio (SNR) of the used channel. $J(\sigma^2_{ch})$ is a function for mutual information between a binary random variable with the same probability of 0 and 1 and a Gaussian random variable having a variance of $\sigma^2_{ch}$.

$J(\sigma)$ may be defined as represented in the following Equation 4.

$$J(\sigma) = 1 - \int_{-\infty}^{+\infty} \frac{1}{\sqrt{2\pi\sigma^2}} e^{-\frac{(y-\sigma^2/2)^2}{2\sigma^2}} \log_2(1 + e^{-y}) dy \quad \text{[Equation 4]}$$

When step S1010 is performed, the polar code decoding apparatus updates the mutual information of a message propagated to a node connected to each node based on the channel mutual information in step S1020. That is, the polar code decoding apparatus updates mutual information $I_{\lambda+1}^L(\phi,\omega)$ of a message which is propagated from the left to the right and mutual information $I_{\lambda+1}^B(\phi,\omega)$ of a message which is propagated from the right to the left. In this case, the mutual information may be updated in accordance with the schedule of a decoding algorithm of the polar codes.

For example, as represented in the protograph of FIG. 4, each mutual information which forms a pair with each LLR message represented by $(\lambda, \phi, \omega)$ may be updated using the following Equation 5.

$$I_\lambda^L(\phi, \omega) = 1 - J\left(\sqrt{J^{-1}(1 - I_{\lambda-1}^L(\psi, 2\omega))^2 + J^{-1}\left(1 - J\left(\sqrt{J^{-1}(I_{\lambda-1}^L(\psi, 2\omega+1))^2 + J^{-1}(I_\lambda^B(\phi+1, \omega))^2}\right)\right)^2}\right)$$

$$I_\lambda^L(\phi+1, \omega) = J\left(\sqrt{J^{-1}(I_{\lambda-1}^L(\psi, 2\omega+1))^2 + J^{-1}\left(1 - J\left(\sqrt{J^{-1}(I_{\lambda-1}^L(\psi, 2\omega))^2 + J^{-1}(I_\lambda^B(\phi, \omega))^2}\right)\right)^2}\right)$$

$$I_{\lambda-1}^B(\psi, 2\omega) = 1 - J\left(\sqrt{J^{-1}(1 - I_\lambda^B(\phi, \omega))^2 + J^{-1}\left(1 - J\left(\sqrt{J^{-1}(I_{\lambda-1}^B(\psi, 2\omega+1))^2 + J^{-1}(I_\lambda^B(\phi+1, \omega))^2}\right)\right)^2}\right)$$

$$I_{\lambda-1}^B(\psi, 2\omega+1) = J\left(\sqrt{J^{-1}(I_\lambda^B(\phi+1, \omega))^2 + J^{-1}\left(1 - J\left(\sqrt{J^{-1}(I_\lambda^B(\phi, \omega))^2 + J^{-1}(I_{\lambda-1}^L(\psi, 2\omega))^2}\right)\right)^2}\right)$$

[Equation 5]

The polar code decoding algorithm described above is as illustrated in FIG. 9.

In the meantime, in order to measure a convergence rate of the decoding algorithm according to the present disclosure, an extrinsic information transfer (EXIT) chart scheme is introduced. A protograph-based EXIT (PEXIT) analysis scheme among EXIT charts has been utilized for the LDPC code analysis. The present disclosure modifies the analysis scheme to apply the scheme to polar code.

FIG. 10 is a flowchart illustrating a convergence rate of decoding polar codes according to an exemplary embodiment of the present disclosure and FIG. 11 is a view illustrating an algorithm of measuring a convergence rate of decoding polar codes according to an exemplary embodiment of the present disclosure.

Referring to FIG. 10, the polar code decoding apparatus calculates channel mutual information which is mutual information for a channel based on a signal received through a channel in step S1010. That is, the polar code decoding apparatus calculates mutual information $I_{ch}$ for a reception signal received from the channel using the following Equation 3 as an initialization process.

$$I_{ch} = J(\sqrt{8RE_b/N_0}) \quad \text{[Equation 3]}$$

The polar code decoding apparatus updates the mutual information in accordance with the same schedule, instead of the LLR message.

When step S1020 is performed, the polar code decoding apparatus calculates APP mutual information which is mutual information between prior LLRs calculated in a code associated with a code word node in step S1030. Here, the APP mutual information is mutual information between posterior LLR which is evaluated by the variable node VN and an associated code word bit $x_j$ and the polar code decoding apparatus may calculate the APP mutual information $I_{APP}(j)$ using the following Equation 6.

$$I_{APP}(j) = J(\sqrt{J^{-1}(I_n^L(0,k))^2 + J^{-1}(I_n^B(0,j))^2}) \quad \text{[Equation 6]}$$

When step S1030 is performed, the polar code decoding apparatus determines whether the APP mutual information is 1 in all nodes in step S1040.

As a determination result of step S1040, when all the mutual information is 1 in all nodes, the polar code decoding apparatus determines that the decoding is converged in step S1050 and calculates a latency (clock cycle) taken to converge the decoding in step S1060. That is, the polar code decoding apparatus may calculate a clock cycle taken to completely converge the decoding by multiplying the number of iterative decoding at the moment that the iterative decoding is converged while performing the iterative decoding and a clock cycle for one decoding.

When it is assumed that a decoder for a polar code having a length of N has N processing units and each processing unit implements Equation 5 at a clock cycle τ, a SCAN decoder requires a clock cycle (2N−3)τ to complete the message update.

The clock cycle of the inner code may be twice the number of layers in the inner code and the clock cycle of the outer code may be the same as the SCAN decoding of the polar code having a length of N/S. Therefore, a clock cycle (latency) $T_s$ taken to completely converge the decoding may be calculated using Equation 7.

$$T_s = \left(2s + \frac{2N}{S} - 3\right)I_s \tau \quad \text{[Equation 7]}$$

Here, $I_s$ is the number of iterations when the scheme with s is completed and τ may refer to a clock cycle to decode the polar code.

An algorithm for measuring a convergence rate of the polar code decoding as described above may be as illustrated in FIG. 11.

The polar code decoding apparatus measures the latency of the polar code decoding until the decoding is converged. Therefore, the latency is given as a multiplication of the number of iterations that the decoding is converged and a clock cycle required for one decoding. The channel environment may be an AWGN channel and a modulation method may be a BPSK method. A length of code is 32,768 (N=$2^{15}$) bits, an SNR of the channel is 1.0 dB, and the code is built to be optimized at 2.0 dB.

FIG. 12 is a graph illustrating a result when a latency of polar code decoding is measured by mutual information according to an exemplary embodiment of the present disclosure. It is assumed that process units as many as the code length are prepared and it takes t clocks for each unit to process the mutual information updating operation.

Referring to FIG. 12, when the level of parallelism is 0, it is the SCAN which is the most sequential way and when the level of parallelism is 14, it is the BP which is the most parallel way. It is understood that when the decoding is performed in more parallel way, the latency is short. Further, it is confirmed that since all decoding is converged, there is no performance degradation.

FIG. 13 is a graph illustrating how a latency, a storage complexity, and a computational complexity change when a level of parallelism is changed, according to an exemplary embodiment of the present disclosure.

Referring to FIG. 13, it is understood that the higher the level of parallelism, the shorter the latency, but the higher the storage and computational complexities, which is inversely proportional thereto. Therefore, it is confirmed that the latency and the complexity form a trade-off relationship. Further, it is understood that a degree of lowering the latency is relatively smaller than a degree of increasing the complexity.

However, the soft-output decoding is essential for a system such as a magnetic recording device in which a turbo-based receiver is utilized so that a method and an apparatus for decoding polar codes according to the present disclosure may be flexibly adaptable to system requirements.

Further, in a desktop computer which utilizes a hard disk driver, a required latency and complexity vary depending on a working environment so that the method and the apparatus for decoding polar codes according to the present disclosure may also be applicable to such a system. For example, when a hard disk starts to read/write after an idle time, the system requires a low latency time even though the storage/computational complexities are increased. In contrast, when the system does not have free system resource due to other works, even though the latency is high, a low storage/computational complexity is required.

Further, the method and the apparatus for decoding polar codes according to the present disclosure may be applied to a hard disk in the notebook computer when it is being charged or it is not charged.

As described above, the method and the apparatus for decoding polar codes according to the present disclosure may be adaptable to various requirements of a system.

The referenced drawings and described detailed description of the present disclosure are the exemplary embodiment of the present disclosure, which are used for the purpose of merely describing the present disclosure, not limiting the scope of the present disclosure which is included in the appended claims. Therefore, it will be appreciated to those skilled in the art that various modifications are made, and other equivalent embodiments are available. Accordingly, the actual scope of the present disclosure must be determined by the spirit of the appended claims.

What is claimed is:

1. A polar code decoding method by a polar code decoding apparatus, the polar code decoding method comprising:
   receiving a code word vector generated by polar encoding; and
   decoding the encoding vector based on a soft cancellation (SCAN) decoding method and a round-trip belief propagation (BP) decoding method,
   in the decoding, an inner code of the code word vector is decoded by the round-trip BP decoding method and an outer code is decoded by the SCAN decoding method,
   wherein the decoding includes:
   updating an input L message of the outer code with a channel LLR as an input value in accordance with a schedule of the round-trip BP, wherein the input L message is a LLR message propagated to leftmost mode of the outer code;
   updating an L message and a B message of the inner code in accordance with a schedule of the SCAN, wherein the L message is a LLR message propagated from left node to right node and the B message is a LLR message propagated from right node to left node; and
   updating an input B message of the outer code with an output LLR updated in accordance with the schedule of the SCAN as an input value in accordance with a schedule of the round-trip BP, wherein the input B message is a LLR message propagated to rightmost node of the inner code.

2. The polar code decoding method according to claim 1, wherein the polar code having a length N is defined as a concatenated code of a plurality of outer codes having a length N/S and one inner code having the length N, where S is $2^a$ and a is a level of parallelism, which determines a number of the plurality of outer codes.

3. The polar code decoding method according to claim 1, further comprising: measuring a convergence rate of polar code decoding based on mutual information of each of the L message and the B message.

4. The polar code decoding method according to claim 3, wherein the measuring of a convergence rate includes:
updating mutual information of the L message and the B message propagated to nodes connected to each node;
determining that the decoding is converged when APP mutual information which is the mutual information between prior LLRs calculated in a code associated with a code word node is 1 in all nodes; and
calculating a clock cycle taken to converge the decoding as the convergence rate.

5. The polar code decoding method according to claim 4, wherein the mutual information is updated in accordance with a decoding schedule of the polar code.

6. The polar code decoding method according to claim 4, wherein the convergence rate is calculated by multiplying the number of iterative decoding at the moment of convergence and the clock cycle for one decoding.

7. A polar code decoding apparatus, comprising:
a receiving unit which receives a code word vector generated by polar encoding; and
a decoding unit which decodes the code word vector based on a soft cancellation (SCAN) decoding method and a round-trip belief propagation (BP) decoding method to output a decoding data bit string,
wherein the decoding unit decodes an inner code of the code word vector by the round-trip BP decoding method and decodes an outer code by the SCAN decoding method,
wherein the decoding unit updates an input L message of the outer code with a channel LLR as an input value in accordance with a schedule of the round-trip BP, wherein the input L message is a LLR message propagated to leftmost node of the outer code,
wherein the decoding unit updates an L message and a B message of the inner code in accordance with a schedule of the SCAN, wherein the L message is a LLR message propagated from left node to right node and the B message is a LLR message propagated from right node to left node, and
wherein the decoding unit updates an input B message of the outer code with an output LLR updated in accordance with the schedule of the SCAN as an input value in accordance with the schedule of the round-trip BP, wherein the input B message is a LLR message propagated to rightmost node of the inner code.

8. The polar code decoding apparatus according to claim 7, further comprising:
a latency measuring unit which measures a convergence rate of polar code decoding based on mutual information of the L message and the B message.

9. The polar code decoding apparatus according to claim 8, wherein the latency measuring unit updates the mutual information of each of the L message and the B message which are propagated to nodes connected to each node, determines that the decoding is converged when APP mutual information which is the mutual information between prior LLRs calculated in a code correlated with a code word node is 1 in all the nodes, and calculates a clock cycle taken to converge the decoding as the convergence rate.

* * * * *